United States Patent
Huang et al.

(10) Patent No.: US 6,288,598 B1
(45) Date of Patent: Sep. 11, 2001

(54) LASER FUSE CIRCUIT DESIGN

(75) Inventors: Johnnie Huang, Santa Clara; Ghasi Agrawal, San Jose, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/705,030

(22) Filed: Nov. 2, 2000

(51) Int. Cl.$^7$ ............................................. H01H 37/76

(52) U.S. Cl. .................................. 327/525; 365/225.7

(58) Field of Search .......................... 327/525, 199, 327/202, 208; 365/225.7, 189.05

(56) References Cited

U.S. PATENT DOCUMENTS

| | | | | |
|---|---|---|---|---|
| 5,566,107 | * | 10/1996 | Gilliam | 327/525 |
| 6,118,712 | * | 9/2000 | Park et al. | 365/225.7 |
| 6,215,351 | * | 4/2001 | Le et al. | 327/525 |
| 6,236,599 | * | 5/2001 | Goto | 365/225.7 |

* cited by examiner

*Primary Examiner*—Toan Tran

(57) ABSTRACT

A fuse circuit that includes a fuse and a full latch connected to the fuse. The fuse circuit is configured to receive a plurality of input signals including a preset signal and an enable signal. Preferably, a first pass gate is connected to the fuse and to the full latch and is configured to receive the enable signal and a second pass gate is connected to the full latch and is configured to receive the preset signal. Preferably, an output signal line is connected to the full latch and is configured to carry the output signal. The fuse circuit is configured to set the fuse using the preset signal. Ideally, the fuse circuit is configured to provide no direct path between VDD and VSS while using the preset signal to set the fuse. The fuse circuit is configured to provide an output signal which is dependent on the status of the fuse and the state of the enable signal. Specifically, the fuse circuit may be configured to provide that the output signal is of the same state as the enable signal if the fuse provides an open circuit and is configured to provide that the output signal is of a different state as the enable signal if the fuse provides a short circuit.

12 Claims, 2 Drawing Sheets

LASER FUSE CIRCUIT DESIGN

FIELD OF THE INVENTION

The present invention relates generally to fuse circuits, and more specifically relates to a fuse circuit that uses a latch circuit or memory cell to store the data.

BACKGROUND OF THE INVENTION

Typically, fuse circuit structures are used in Application Specific Integrated Circuits (ASIC) for permanently storing a bit of information. There are more and more applications where it is desirable to use a fuse to store data (e.g. storing defective addresses in Built-In-Self-Repair, storing a unique identification number for some chips, etc.). A basic fuse is just a metal wire on the chip, where one end of the metal wire is connected to one of the logic levels and the other end of the metal wire is used to read the logic level. If the connected logic level is not desired, the end of the metal wire is blown using a laser machine. When the fuse is blown, the other end of the fuse will appear as floating logic. Hence, some circuitry must be used to provide opposite data for the open circuit.

A prior art fuse circuit structure design is illustrated in FIG. 1. Specifically, the fuse circuit structure is shown within the dotted box 10, and the remaining circuitry 20 is configured to read and hold the coded value in the fuse once it is coded. As shown, the design requires an extra flip flop to hold the data.

When the ENABLE signal is active:

If the fuse is blown, then the value at node D (the output 22 of the fuse) is "1" and when a clock edge is provided, the D value would go through multiplexer 24 and get stored in the first half-latch. The ENABLE signal can then be turned off.

If the fuse is not blown, then the value at node D (the output 22 of the fuse) is "0" and when a clock edge is provided, the D value would go through multiplexer 24 and get stored in the first half-latch. The ENABLE signal can then be turned off.

Once the coded value is read, the ENABLE signal is turned off. Even if the circuit is being clocked (CLK remains ON), then the stored value is fed back through the multiplexer xx and the read value is not effected.

A disadvantage to the circuitry illustrated in FIG. 1 is that it requires the ENABLE signal to be kept ON for almost one half of the clock cycle, during which there is a direct path from VDD to VSS. This results in significant power consumption. Moreover, when the ENABLE signal is turned off, the circuitry requires a feedback path to store the coded and read data from the fuse. As shown in FIG. 1, the latch or flip-flop circuitry requires a number of transistors. If a simple and regular latch circuit is used at the output, the transistors used in the fuse circuit would need to be large in order to change the data inside the latch. Due to its static current, the latch circuit could burn the unblown fuse if it is enabled for a long enough period of time.

Another prior art fuse circuit structure design is illustrated in FIG. 2. As shown, the structure uses a half latch circuit 30 that includes three transistors. When the fuse is not blown, the output will have logic 1, and when the fuse is blown, the output will have logic 0 (when power is up). As shown in FIG. 2, no flip-flop is needed to hold the data. The circuitry shown in FIG. 2 also consumes significant power when the ENABLE signal is turned on because it would have a direct path from VDD to VSS.

Still other prior art suggests removing the transistor which connects to the ENABLE signal and relies on a capacitance divider to ensure that the circuit arrives in the correct state. However, since a half latch is used, it is possible that the incorrect output is generated if there is high ohm leakage resistance at the input of the inverter. The high ohm leakage resistance can "pull down" the inverter input to logic 0 before the feedback transistor turns on and supports pulling up the input of the inverter when the power is on.

OBJECTS AND SUMMARY

It is an object of an embodiment of the present invention to provide a fuse circuit which uses a latch circuit or memory cell to store data.

Another object of an embodiment of the present invention is to provide a fuse circuit which uses a full latch circuit instead of a half latch circuit and two pass gates in order to avoid leakage or stray resistance at an inverter input.

Still another object of an embodiment of the present invention is to provide a fuse circuit which has low power consumption, provides that there is no effect due to leakage/stray resistance, is capable of using the fuse data directly from the output of the fuse circuitry, and provides that a single port memory layout can be used for the actual transistors used in the fuse circuit.

Still yet another object of an embodiment of the present invention is to provide a fuse circuit which is very reliable, is small due to usage of single port memory and consumes very little power during power up setting.

Briefly, and in accordance with at least one of the foregoing objects, an embodiment of the present invention provides a fuse circuit that includes a fuse and a full latch connected to the fuse. The fuse circuit is configured to receive a plurality of input signals including a preset signal and an enable signal.

Preferably, a first pass gate is connected to the fuse and to the full latch and is configured to receive the enable signal and a second pass gate is connected to the full latch and is configured to receive the preset signal. Preferably, an output signal line is connected to the full latch and is configured to carry the output signal.

The fuse circuit is preferably configured to set the fuse using the preset signal. Ideally, the fuse circuit is configured to provide no direct path between VDD and VSS while using the preset signal to set the fuse. The fuse circuit is configured to provide an output signal which is dependent on the status of the fuse and the state of the enable signal. Specifically, the fuse circuit may be configured to provide that the output signal is of the same state as the enable signal if the fuse provides an open circuit and is configured to provide that the output signal is of a different state as the enable signal if the fuse provides a short circuit.

BRIEF DESCRIPTION OF THE DRAWINGS

The present invention and the advantages thereof will become more apparent upon consideration of the following detailed description when taken in conjunction with the accompanying drawings of which.

DESCRIPTION

Figure 1:
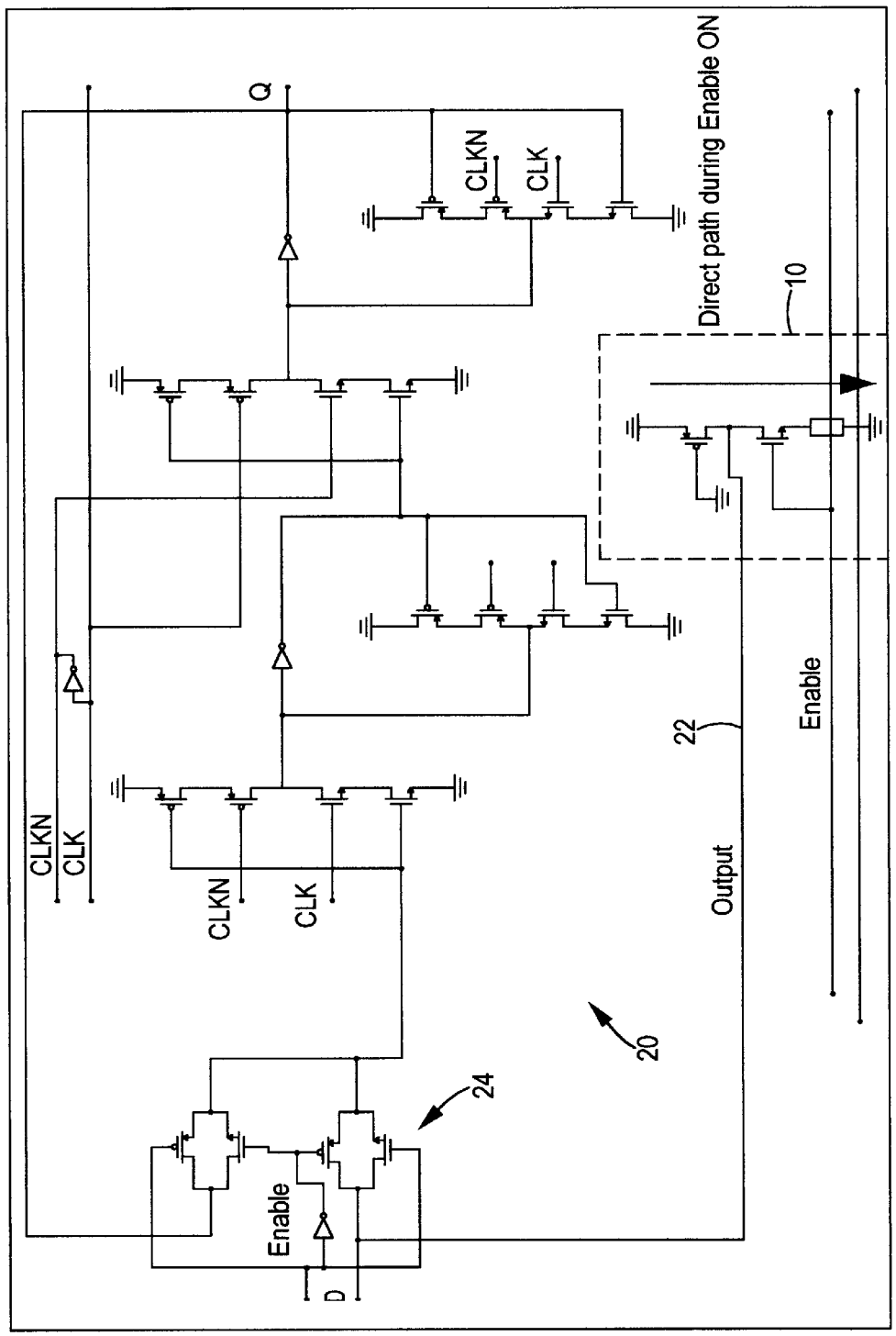
FIG. 1 is a schematic diagram illustrating a prior art fuse circuit structure.
Figure 2:
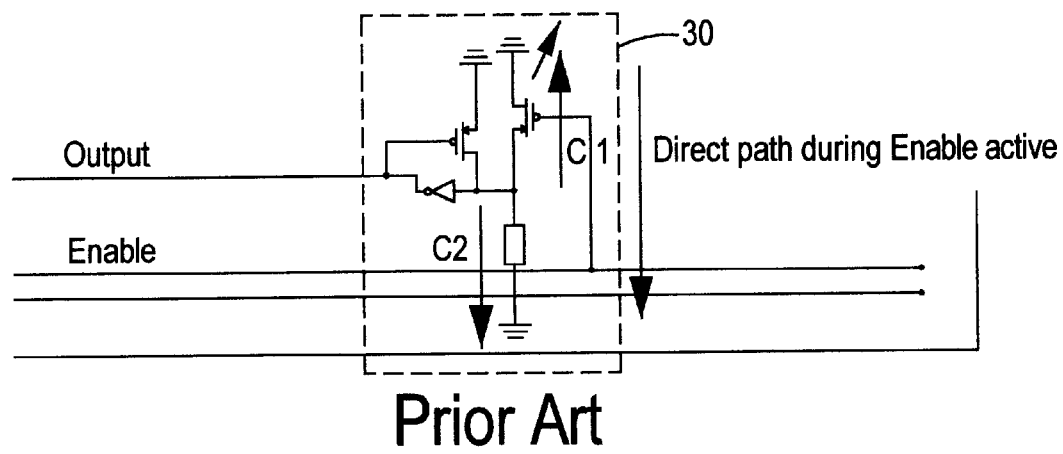
FIG. 2 is a schematic diagram illustrating another prior art fuse circuit structure.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Figure 3:
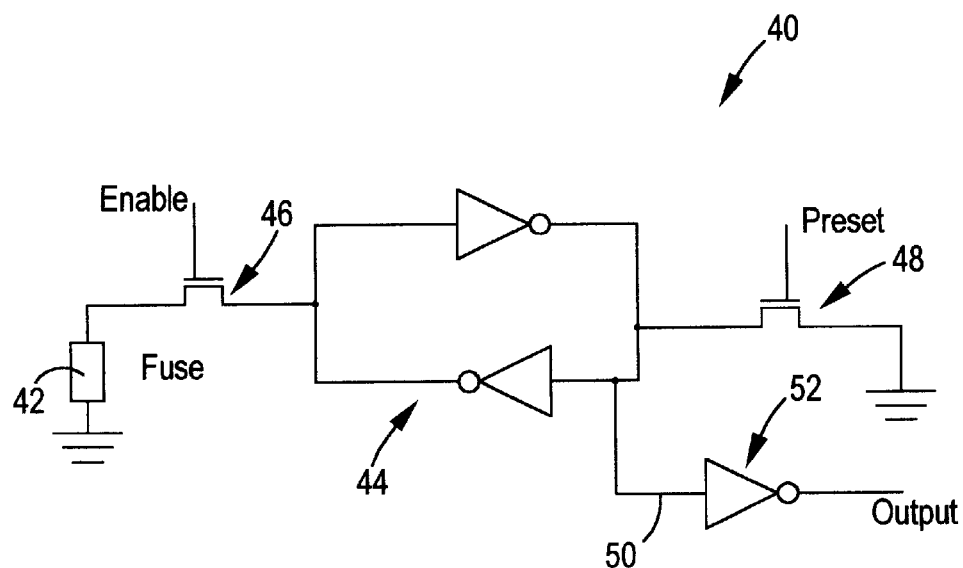
FIG. 3 is a schematic diagram illustrating a fuse circuit structure which is in accordance with an embodiment of the present invention.

A fuse circuit structure 40 which is in accordance with an embodiment of the present invention is illustrated schematically in FIG. 3. As shown, the fuse circuit 40 includes a fuse 42 and a full latch 44 which is connected to the fuse 42. The circuit 40 also includes two pass gates 46 and 48. A first pass gate 46 is connected to the fuse 42 and the full latch 44 and is configured to receive an ENABLE signal (see FIG. 1). A second pass gate 48 is connected to the full latch 44 and is configured to receive a Preset signal. The circuit also includes an output signal line 50 which is connected to the full latch 44 and is configured to carry an output signal. As shown, an inverter 52 is disposed on the output signal line 50.

The circuit 40 shown in FIG. 3 uses a full latch circuit 44 instead of a half latch circuit and two pass gates 46, 48 in order to avoid the leakage or stray resistance which would otherwise result at the input of the inverter 52 on the output signal line 50. The two transistor combination also removes the power consumption that would otherwise result during setting the value of the fuse 42 after power up.

As shown in FIG. 3, the design is similar to a single port memory cell configuration, but with the access transistor connected to two different signals (Enable and Preset). The following table shows the various modes of operation of the circuit 40 shown in FIG. 3:

Hence, the circuit 40 is configured to set the fuse using the preset signal, and is configured to provide an output signal, wherein a value of the output signal is dependent on a status of the fuse 42 and a state of the Enable signal. As shown in the table, the circuit 40 is configured to provide that the output signal is of the same state as the Enable signal if the fuse 42 provides an open circuit, and is configured to provide that the output signal is of a different state as the Enable signal if the fuse 42 provides a short circuit.

Advantages of the circuit 40 shown in FIG. 3 is that it is low power, there is no effect due to leakage/stray resistance, and the circuit is capable of using the fuse data directly from the output of the fuse circuitry because it does not require an extra flip flop to hold the data. Moreover, a single port memory layout can be used (which is generally very compact) for the actual six transistors that are to be used in the fuse circuit.

The circuit shown in FIG. 3 provides that the Enable and Preset signals are used to remove the direct path between VDD and VSS during setting the fuses after power up. Additionally, the circuit provides that a compact single port memory circuit can be used for the fuse supporting circuitry. The circuit 40 shown in FIG. 3 is very reliable, is small (due to the usage of a single port memory) and consumes almost no power during power up setting.

While an embodiment of the present invention is shown and described, it is envisioned that those skilled in the art may devise various modifications of the present invention without departing from the spirit and scope of the appended claims.

What is claimed is:

1. A fuse circuit comprising: a fuse and a full latch connected to said fuse, said fuse circuit configured to receive a plurality of input signals including a preset signal and an enable signal, wherein said fuse circuit is configured to set said fuse using said preset signal, said fuse circuit configured to provide an output signal, wherein a value of said output signal is dependent on a status of said fuse and a state of said enable signal.

2. A fuse circuit as recited in claim 1, further comprising a pass gate connected to said fuse and to said full latch and configured to receive said enable signal.

3. A fuse circuit as recited in claim 1, further comprising a pass gate connected to said full latch and configured to receive said preset signal.

4. A fuse circuit as recited in claim 1, further comprising a first pass gate connected to said fuse and to said full latch and configured to receive said enable signal and a second pass gate connected to said full latch and configured to receive said preset signal.

5. A fuse circuit as recited in claim 1, further comprising an output signal line connected to said full latch and configured to carry said output signal.

6. A fuse circuit as recited in claim 1, wherein said fuse circuit is configured to provide no direct path between VDD and VSS while using said preset signal to set said fuse.

7. A fuse circuit as recited in claim 1, wherein said fuse circuit is configured to provide that said output signal is of the same state as said enable signal if said fuse provides an open circuit.

8. A fuse circuit as recited in claim 1, wherein said fuse circuit is configured to provide that said output signal is of a different state as said enable signal if said fuse provides a short circuit.

9. A fuse circuit as recited in claim 1, wherein said fuse circuit is configured to provide that said output signal is of the same state as said enable signal if said fuse provides an open circuit and is configured to provide that said output signal is of a different state as said enable signal if said fuse provides a short circuit.

10. A fuse circuit as recited in claim 1, further comprising a first pass gate connected to said fuse and to said full latch and configured to receive said enable signal and a second pass gate connected to said full latch and configured to receive said preset signal, wherein said fuse circuit is configured to provide that said output signal is of the same state as said enable signal if said fuse provides an open circuit.

11. A fuse circuit as recited in claim 1, further comprising a first pass gate connected to said fuse and to said full latch and configured to receive said enable signal and a second pass gate connected to said full latch and configured to receive said preset signal, wherein said fuse circuit is configured to provide that said output signal is of a different state as said enable signal if said fuse provides a short circuit.

12. A fuse circuit as recited in claim 1, further comprising a first pass gate connected to said fuse and to said full latch and configured to receive said enable signal and a second pass gate connected to said full latch and configured to receive said preset signal, wherein said fuse circuit is configured to provide that said output signal is of the same state as said enable signal if said fuse provides an open circuit and is configured to provide that said output signal is of a different state as said enable signal if said fuse provides a short circuit.

* * * * *